(12) United States Patent
Sreenivasan et al.

(10) Patent No.: US 7,136,150 B2
(45) Date of Patent: Nov. 14, 2006

(54) IMPRINT LITHOGRAPHY TEMPLATE HAVING OPAQUE ALIGNMENT MARKS

(75) Inventors: Sidlgata V. Sreenivasan, Austin, TX (US); Philip D. Schumaker, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 10/670,980

(22) Filed: Sep. 25, 2003

(65) Prior Publication Data

US 2005/0067379 A1 Mar. 31, 2005

(51) Int. Cl.
*G03B 27/62* (2006.01)
*G03B 27/58* (2006.01)

(52) U.S. Cl. .......................................... 355/75; 355/72
(58) Field of Classification Search ................... 355/75, 355/53, 72; 356/399, 400, 401; 430/22, 430/30, 322; 250/548
See application file for complete search history.

(56) References Cited

U.S. PATENT DOCUMENTS

| | | | |
|---|---|---|---|
| 3,527,062 A | 9/1970 | Belinski et al. |
| 3,783,520 A | 1/1974 | King |
| 3,807,027 A | 4/1974 | Heisler |
| 3,807,029 A | 4/1974 | Troeger |
| 3,811,665 A | 5/1974 | Seelig |
| 4,062,600 A | 12/1977 | Wyse |
| 4,070,116 A | 1/1978 | Frosch et al. |
| 4,098,001 A | 7/1978 | Watson |
| 4,119,688 A | 10/1978 | Hiraoka |
| 4,155,169 A | 5/1979 | Drake et al. |
| 4,201,800 A | 5/1980 | Alcorn et al. |
| 4,202,107 A | 5/1980 | Watson |
| 4,267,212 A | 5/1981 | Sakawaki |
| 4,326,805 A | 4/1982 | Feldman et al. |
| 4,337,579 A | 7/1982 | De Fazio |
| 4,355,469 A | 10/1982 | Nevins et al. |
| 4,414,750 A | 11/1983 | De Fazio |
| 4,426,247 A | 1/1984 | Tamamura et al. |
| 4,440,804 A | 4/1984 | Milgram |
| 4,451,507 A | 5/1984 | Beltz et al. |
| 4,507,331 A | 3/1985 | Hiraoka |
| 4,512,848 A | 4/1985 | Deckman et al. |
| 4,544,572 A | 10/1985 | Sandvig et al. |
| 4,552,832 A | 11/1985 | Blume et al. |
| 4,552,833 A | 11/1985 | Ito et al. |
| 4,600,309 A | 7/1986 | Fay |
| 4,610,442 A | 9/1986 | Oku et al. |
| 4,657,845 A | 4/1987 | Frechet et al. |

(Continued)

FOREIGN PATENT DOCUMENTS

DE 2800476 7/1978

(Continued)

OTHER PUBLICATIONS

Abstract of Japanese Patent 02-24848, Jan. 26, 1990.

(Continued)

*Primary Examiner*—Peter B. Kim
(74) *Attorney, Agent, or Firm*—Michael D. Carter

(57) ABSTRACT

The present invention is directed to providing a template with alignment marks that are opaque to selective wavelength of light. In one embodiment, a template is provided having patterning areas and a template, with the template mark being formed from metal and disposed outside of the patterning areas. The alignment marks may be surrounded by a moat to prevent curable liquid from being in superimposition therewith during imprinting. In this manner, opaque alignment marks may be employed without degrading the quality of the pattern formed during imprinting.

20 Claims, 8 Drawing Sheets

U.S. PATENT DOCUMENTS

| | | |
|---|---|---|
| 4,692,205 A | 9/1987 | Sachdev et al. |
| 4,694,703 A | 9/1987 | Routson |
| 4,707,218 A | 11/1987 | Giammarco et al. |
| 4,722,878 A | 2/1988 | Watakabe et al. |
| 4,724,222 A | 2/1988 | Feldman |
| 4,731,155 A | 3/1988 | Napoli et al. |
| 4,737,425 A | 4/1988 | Lin et al. |
| 4,763,886 A | 8/1988 | Takei |
| 4,772,878 A | 9/1988 | Kane |
| 4,808,511 A | 2/1989 | Holmes |
| 4,826,943 A | 5/1989 | Ito et al. |
| 4,846,931 A | 7/1989 | Gmitter et al. |
| 4,848,179 A | 7/1989 | Ubhayakar |
| 4,848,911 A | 7/1989 | Uchida et al. |
| 4,857,477 A | 8/1989 | Kanamori |
| 4,883,561 A | 11/1989 | Gmitter et al. |
| 4,887,283 A | 12/1989 | Hosno |
| 4,891,303 A | 1/1990 | Garza et al. |
| 4,908,298 A | 3/1990 | Hefferon et al. |
| 4,909,151 A | 3/1990 | Fukui et al. |
| 4,919,748 A | 4/1990 | Bredbenner et al. |
| 4,921,778 A | 5/1990 | Thackeray et al. |
| 4,929,083 A | 5/1990 | Brunner |
| 4,931,351 A | 6/1990 | McColgin et al. |
| 4,959,252 A | 9/1990 | Bonnebat et al. |
| 4,964,145 A | 10/1990 | Maldonado |
| 4,964,945 A | 10/1990 | Calhoun et al. |
| 4,976,818 A | 12/1990 | Hashimoto et al. |
| 4,980,316 A | 12/1990 | Huebner |
| 4,999,280 A | 3/1991 | Hiraoka |
| 5,028,366 A | 7/1991 | Harakal et al. |
| 5,053,318 A | 10/1991 | Gulla et al. |
| 5,063,321 A | 11/1991 | Carter |
| 5,071,694 A | 12/1991 | Uekita et al. |
| 5,072,126 A | 12/1991 | Progler |
| 5,073,230 A | 12/1991 | Maracas et al. |
| 5,074,667 A | 12/1991 | Miyatake |
| 5,108,875 A | 4/1992 | Thackeray et al. |
| 5,110,514 A | 5/1992 | Soane |
| 5,126,006 A | 6/1992 | Cronin et al. |
| 5,148,036 A | 9/1992 | Matsugu et al. |
| 5,148,037 A | 9/1992 | Suda et al. |
| 5,151,754 A | 9/1992 | Ishibashi et al. |
| 5,155,749 A | 10/1992 | DiMila et al. |
| 5,169,494 A | 12/1992 | Hashimoto et al. |
| 5,171,490 A | 12/1992 | Fudim |
| 5,173,393 A | 12/1992 | Sezi et al. |
| 5,179,863 A | 1/1993 | Uchida et al. |
| 5,198,326 A | 3/1993 | Hashimoto et al. |
| 5,204,739 A | 4/1993 | Domenicali |
| 5,206,983 A | 5/1993 | Guckel et al. |
| 5,212,147 A | 5/1993 | Sheats |
| 5,218,193 A | 6/1993 | Miyatake |
| 5,234,793 A | 8/1993 | Sebald et al. |
| 5,240,550 A | 8/1993 | Boehnke et al. |
| 5,240,878 A | 8/1993 | Fitzsimmons et al. |
| 5,242,711 A | 9/1993 | DeNatale et al. |
| 5,244,818 A | 9/1993 | Jokerst et al. |
| 5,259,926 A | 11/1993 | Kuwabara et al. |
| 5,270,984 A | 12/1993 | Mine |
| 5,277,749 A | 1/1994 | Griffith et al. |
| 5,314,772 A | 5/1994 | Kozicki et al. |
| 5,318,870 A | 6/1994 | Hartney |
| 5,324,683 A | 6/1994 | Fitch et al. |
| 5,328,810 A | 7/1994 | Lowrey et al. |
| 5,330,881 A | 7/1994 | Sidman et al. |
| 5,348,616 A | 9/1994 | Hartman et al. |
| 5,355,219 A | 10/1994 | Araki et al. |
| 5,357,122 A | 10/1994 | Okubora et al. |
| 5,362,606 A | 11/1994 | Hartney et al. |
| 5,366,851 A | 11/1994 | Novembre |
| 5,374,454 A | 12/1994 | Bickford et al. |
| 5,376,810 A | 12/1994 | Hoenk et al. |
| 5,380,474 A | 1/1995 | Rye et al. |
| 5,392,123 A | 2/1995 | Marcus et al. |
| 5,414,514 A | 5/1995 | Smith et al. |
| 5,417,802 A | 5/1995 | Obeng |
| 5,421,981 A | 6/1995 | Leader et al. |
| 5,422,295 A | 6/1995 | Choi et al. |
| 5,424,549 A | 6/1995 | Feldman |
| 5,425,848 A | 6/1995 | Haisma et al. |
| 5,425,964 A | 6/1995 | Southwell et al. |
| 5,431,777 A | 7/1995 | Austin |
| 5,439,766 A | 8/1995 | Day et al. |
| 5,452,090 A | 9/1995 | Progler et al. |
| 5,453,157 A | 9/1995 | Jeng |
| 5,458,520 A | 10/1995 | DeMercurio et al. |
| 5,468,542 A | 11/1995 | Crouch |
| 5,477,058 A * | 12/1995 | Sato ......................... 250/548 |
| 5,480,047 A | 1/1996 | Tanigawa et al. |
| 5,504,793 A | 4/1996 | Chen |
| 5,507,411 A | 4/1996 | Peckels |
| 5,508,527 A | 4/1996 | Kuroda et al. |
| 5,512,131 A | 4/1996 | Kumar et al. |
| 5,515,167 A | 5/1996 | Ledger et al. |
| 5,523,878 A | 6/1996 | Wallace et al. |
| 5,527,662 A | 6/1996 | Hashimoto et al. |
| 5,545,367 A | 8/1996 | Bae et al. |
| 5,563,702 A | 10/1996 | Emery et al. |
| 5,566,584 A | 10/1996 | Briganti |
| 5,601,641 A | 2/1997 | Stephens |
| 5,633,505 A | 5/1997 | Chung et al. |
| 5,654,238 A | 8/1997 | Cronin et al. |
| 5,669,303 A | 9/1997 | Maracas et al. |
| 5,670,415 A | 9/1997 | Rust |
| 5,700,626 A | 12/1997 | Lee et al. |
| 5,723,176 A | 3/1998 | Keyworth et al. |
| 5,724,145 A | 3/1998 | Kondo et al. |
| 5,725,788 A | 3/1998 | Maracas et al. |
| 5,726,548 A | 3/1998 | Chiba et al. |
| 5,731,981 A | 3/1998 | Simard |
| 5,736,424 A | 4/1998 | Prybyla et al. |
| 5,737,064 A | 4/1998 | Inoue et al. |
| 5,743,998 A | 4/1998 | Park |
| 5,747,102 A | 5/1998 | Smith et al. |
| 5,753,014 A | 5/1998 | Van Rijn |
| 5,760,500 A | 6/1998 | Kondo et al. |
| 5,772,905 A | 6/1998 | Chou |
| 5,776,748 A | 7/1998 | Singhvi et al. |
| 5,779,799 A | 7/1998 | Davis |
| 5,785,918 A | 7/1998 | Hull |
| 5,802,914 A | 9/1998 | Fassler et al. |
| 5,804,474 A | 9/1998 | Sakaki et al. |
| 5,808,742 A | 9/1998 | Everett et al. |
| 5,825,482 A | 10/1998 | Nikooahadetal et al. |
| 5,849,209 A | 12/1998 | Kindt-Larsen et al. |
| 5,849,222 A | 12/1998 | Jen et al. |
| 5,855,686 A | 1/1999 | Rust |
| 5,876,550 A | 3/1999 | Feygin et al. |
| 5,877,036 A | 3/1999 | Kawai |
| 5,877,861 A | 3/1999 | Ausschnitt et al. |
| 5,884,292 A | 3/1999 | Baker et al. |
| 5,888,650 A | 3/1999 | Calhoun et al. |
| 5,895,263 A | 4/1999 | Carter et al. |
| 5,900,160 A | 5/1999 | Whitesides et al. |
| 5,907,782 A | 5/1999 | Wu |
| 5,912,049 A | 6/1999 | Shirley |
| 5,926,690 A | 7/1999 | Toprac et al. |
| 5,937,758 A | 8/1999 | Maracas et al. |
| 5,942,871 A | 8/1999 | Lee |
| 5,948,219 A | 9/1999 | Rohner |
| 5,948,470 A | 9/1999 | Harrison et al. |
| 5,948,570 A | 9/1999 | Kornblut et al. |
| 5,952,127 A | 9/1999 | Yamanaka |

| Patent | Date | Name |
|---|---|---|
| 5,988,859 A | 11/1999 | Kirk |
| 5,999,245 A | 12/1999 | Suzuki |
| 6,033,977 A | 3/2000 | Gutsche et al. |
| 6,035,805 A | 3/2000 | Rust |
| 6,036,055 A | 3/2000 | Mogadam et al. |
| 6,038,280 A | 3/2000 | Rossiger et al. |
| 6,039,897 A | 3/2000 | Lochhead et al. |
| 6,046,056 A | 4/2000 | Parce et al. |
| 6,049,373 A | 4/2000 | Miyatake |
| 6,051,345 A | 4/2000 | Huang |
| 6,074,827 A | 6/2000 | Nelson et al. |
| 6,081,334 A | 6/2000 | Grimbergen et al. |
| 6,088,103 A | 7/2000 | Everett et al. |
| 6,091,485 A | 7/2000 | Li et al. |
| 6,096,655 A | 8/2000 | Lee et al. |
| 6,117,708 A | 9/2000 | Wensel |
| 6,125,183 A | 9/2000 | Jiawook et al. |
| 6,128,085 A | 10/2000 | Buermann et al. |
| 6,133,576 A | 10/2000 | Shafer et al. |
| 6,137,562 A | 10/2000 | Masuyuki et al. |
| 6,143,412 A | 11/2000 | Schueller et al. |
| 6,150,231 A | 11/2000 | Muller et al. |
| 6,150,680 A | 11/2000 | Eastman et al. |
| 6,168,845 B1 | 1/2001 | Fontana, Jr. et al. |
| 6,180,239 B1 | 1/2001 | Whitesides et al. |
| 6,182,042 B1 | 1/2001 | Peevers |
| 6,188,150 B1 | 2/2001 | Spence |
| 6,190,929 B1 | 2/2001 | Wang et al. |
| 6,204,922 B1 | 3/2001 | Chalmers |
| 6,218,316 B1 | 4/2001 | Marsh |
| 6,234,379 B1 | 5/2001 | Donges |
| 6,245,213 B1 | 6/2001 | Olsson et al. |
| 6,245,581 B1 | 6/2001 | Bonser et al. |
| 6,274,294 B1 | 8/2001 | Hines |
| 6,285,439 B1 | 9/2001 | Miyatake |
| 6,295,120 B1 | 9/2001 | Miyatake |
| 6,309,580 B1 | 10/2001 | Chou |
| 6,316,290 B1 | 11/2001 | Wensel |
| 6,326,627 B1 | 12/2001 | Putvinski et al. |
| 6,329,256 B1 | 12/2001 | Ibok |
| 6,334,960 B1 | 1/2002 | Willson et al. |
| 6,337,262 B1 | 1/2002 | Pradeep et al. |
| 6,355,198 B1 | 3/2002 | Kim et al. |
| 6,361,831 B1 | 3/2002 | Sato et al. |
| 6,383,888 B1 | 5/2002 | Stirton |
| 6,383,928 B1 | 5/2002 | Eissa |
| 6,387,783 B1 | 5/2002 | Furukawa et al. |
| 6,387,787 B1 | 5/2002 | Mancini et al. |
| 6,388,253 B1 | 5/2002 | Su |
| 6,388,755 B1 | 5/2002 | Zhao |
| 6,391,217 B1 | 5/2002 | Schaffer et al. |
| 6,391,798 B1 | 5/2002 | DeFelice et al. |
| 6,407,340 B1 | 6/2002 | Wikstrom et al. |
| 6,411,010 B1 | 6/2002 | Suzuki et al. |
| 6,420,892 B1 | 7/2002 | Krivy et al. |
| 6,423,207 B1 | 7/2002 | Heidari et al. |
| 6,437,891 B1 | 8/2002 | Chandrasekhar et al. |
| 6,447,919 B1 | 9/2002 | Brown et al. |
| 6,455,411 B1 | 9/2002 | Jiang et al. |
| 6,467,761 B1 | 10/2002 | Amatucci et al. |
| 6,482,742 B1 | 11/2002 | Chou |
| 6,489,068 B1 | 12/2002 | Kye |
| 6,495,624 B1 | 12/2002 | Brown |
| 6,514,672 B1 | 2/2003 | Young et al. |
| 6,517,977 B1 | 2/2003 | Resnick et al. |
| 6,517,995 B1 | 2/2003 | Jacobenson et al. |
| 6,518,168 B1 | 2/2003 | Clem et al. |
| 6,518,189 B1 | 2/2003 | Chou |
| 6,521,324 B1 | 2/2003 | Debe et al. |
| 6,522,411 B1 | 2/2003 | Moon et al. |
| 6,534,418 B1 | 3/2003 | Plat et al. |
| 6,539,286 B1 | 3/2003 | Jiang |
| 6,541,356 B1 | 4/2003 | Fogel et al. |
| 6,541,360 B1 | 4/2003 | Plat et al. |
| 6,561,706 B1 | 5/2003 | Singh et al. |
| 6,565,928 B1 | 5/2003 | Sakamoto et al. |
| 6,580,172 B1 | 6/2003 | Mancini et al. |
| 6,580,505 B1 | 6/2003 | Bareket |
| 6,588,632 B1 | 7/2003 | Nicol |
| 6,600,969 B1 | 7/2003 | Sudolcan et al. |
| 6,630,410 B1 | 10/2003 | Trapp et al. |
| 6,632,742 B1 | 10/2003 | Yang et al. |
| 6,633,391 B1 | 10/2003 | Oluseyi et al. |
| 6,635,581 B1 | 10/2003 | Wong |
| 6,636,311 B1 | 10/2003 | Ina et al. |
| 6,646,662 B1 | 11/2003 | Nebashi et al. |
| 6,665,119 B1 | 12/2003 | Kurtz et al. |
| 6,677,252 B1 | 1/2004 | Marsh |
| 6,696,157 B1 | 2/2004 | David et al. |
| 6,696,220 B1 | 2/2004 | Bailey et al. |
| 6,703,190 B1 | 3/2004 | Elian et al. |
| 6,713,238 B1 | 3/2004 | Chou et al. |
| 6,716,754 B1 | 4/2004 | Hofmann et al. |
| 6,716,767 B1 | 4/2004 | Shih et al. |
| 6,719,915 B1 | 4/2004 | Willson et al. |
| 6,730,256 B1 | 5/2004 | Bloomstein et al. |
| 6,737,202 B1 | 5/2004 | Gehoski et al. |
| 6,743,713 B1 | 6/2004 | Mukherjee-Roy et al. |
| 6,753,972 B1 | 6/2004 | Hirose et al. |
| 6,767,983 B1 | 7/2004 | Fujiyama et al. |
| 6,770,852 B1 | 8/2004 | Steger |
| 6,776,094 B1 | 8/2004 | Whitesides et al. |
| 6,777,170 B1 | 8/2004 | Bloomstein et al. |
| 6,791,669 B1 | 9/2004 | Poon |
| 6,805,054 B1 | 10/2004 | Meissl et al. |
| 6,828,244 B1 | 12/2004 | Chou |
| 6,842,229 B1 | 1/2005 | Sreenivasan et al. |
| 6,890,688 B1 | 5/2005 | Mancini et al. |
| 6,902,853 B1 | 6/2005 | Sreenivasan et al. |
| 2001/0023042 A1 | 9/2001 | Dirksen et al. |
| 2001/0023829 A1 | 9/2001 | Olsson et al. |
| 2001/0040145 A1 | 11/2001 | Willson et al. |
| 2002/0042027 A1 | 4/2002 | Chou et al. |
| 2002/0069525 A1 | 6/2002 | Hada et al. |
| 2002/0093122 A1 | 7/2002 | Choi et al. |
| 2002/0094496 A1 | 7/2002 | Choi et al. |
| 2002/0098426 A1 | 7/2002 | Sreenivasan et al. |
| 2002/0132482 A1 | 9/2002 | Chou |
| 2002/0135099 A1 | 9/2002 | Robinson et al. |
| 2002/0150398 A1 | 10/2002 | Choi et al. |
| 2002/0167117 A1 | 11/2002 | Chou |
| 2002/0175298 A1 | 11/2002 | Moniwa et al. |
| 2002/0177319 A1 | 11/2002 | Chou |
| 2003/0034329 A1 | 2/2003 | Chou |
| 2003/0080471 A1 | 5/2003 | Chou |
| 2003/0080472 A1 | 5/2003 | Chou |
| 2003/0081193 A1 | 5/2003 | White et al. |
| 2003/0092261 A1 | 5/2003 | Kondo et al. |
| 2003/0113638 A1 | 6/2003 | Mancini et al. |
| 2003/0129542 A1 | 7/2003 | Shih et al. |
| 2003/0133126 A1 | 7/2003 | Sarfaty et al. |
| 2003/0179354 A1 | 9/2003 | Araki et al. |
| 2003/0180631 A1* | 9/2003 | Shiota et al. ................ 430/5 |
| 2003/0205657 A1 | 11/2003 | Voisin |
| 2003/0205658 A1 | 11/2003 | Voisin |
| 2003/0215577 A1 | 11/2003 | Willson et al. |
| 2003/0235787 A1 | 12/2003 | Watts et al. |
| 2004/0007799 A1 | 1/2004 | Choi et al. |
| 2004/0008334 A1 | 1/2004 | Sreenivasan et al. |
| 2004/0009673 A1 | 1/2004 | Sreenivasan et al. |
| 2004/0010341 A1 | 1/2004 | Watts et al. |
| 2004/0021254 A1 | 2/2004 | Sreenivasan et al. |
| 2004/0021866 A1 | 2/2004 | Watts et al. |
| 2004/0022888 A1 | 2/2004 | Sreenivasan et al. |
| 2004/0029041 A1 | 2/2004 | Shih et al. |
| 2004/0033515 A1 | 2/2004 | Cao et al. |

| | | | |
|---|---|---|---|
| 2004/0036201 A1 | 2/2004 | Chou et al. | |
| 2004/0038552 A1 | 2/2004 | Watts et al. | |
| 2004/0046271 A1 | 3/2004 | Watts | |
| 2004/0046288 A1 | 3/2004 | Chou | |
| 2004/0053146 A1 | 3/2004 | Sreenivasala et al. | |
| 2004/0065252 A1 | 4/2004 | Sreenivasan et al. | |
| 2004/0065976 A1 | 4/2004 | Sreenivasan et al. | |
| 2004/0086793 A1 | 5/2004 | Sreenivasan et al. | |
| 2004/0089979 A1 | 5/2004 | Rubin | |
| 2004/0090611 A1 | 5/2004 | Choi et al. | |
| 2004/0104641 A1 | 6/2004 | Choi et al. | |
| 2004/0110856 A1 | 6/2004 | Young et al. | |
| 2004/0112153 A1 | 6/2004 | Choi et al. | |
| 2004/0112861 A1 | 6/2004 | Choi et al. | |
| 2004/0112862 A1 | 6/2004 | Willson et al. | |
| 2004/0116548 A1 | 6/2004 | Willson | |
| 2004/0118809 A1 | 6/2004 | Chou et al. | |
| 2004/0124566 A1 | 7/2004 | Sreenivasan et al. | |
| 2004/0131718 A1 | 7/2004 | Chou et al. | |
| 2004/0137734 A1 | 7/2004 | Chou et al. | |
| 2004/0141163 A1 | 7/2004 | Bailey et al. | |
| 2004/0141168 A1 | 7/2004 | Sreenivasan et al. | |
| 2004/0146792 A1 | 7/2004 | Nimmakayala et al. | |
| 2004/0149687 A1 | 8/2004 | Choi et al. | |
| 2004/0150129 A1 | 8/2004 | Hougham et al. | |
| 2004/0156108 A1 | 8/2004 | Chou et al. | |
| 2004/0163563 A1 | 8/2004 | Sreenivasan et al. | |
| 2004/0168586 A1 | 9/2004 | Bailey et al. | |
| 2004/0168588 A1 | 9/2004 | Choi et al. | |
| 2004/0168613 A1 | 9/2004 | Nguyen | |
| 2004/0169441 A1 | 9/2004 | Choi et al. | |
| 2004/0170770 A1 | 9/2004 | Nguyen | |
| 2004/0170771 A1 | 9/2004 | Bailey et al. | |
| 2004/0188381 A1 | 9/2004 | Sreenivasan et al. | |
| 2004/0189994 A1 | 9/2004 | Sreenivasan et al. | |
| 2004/0189996 A1 | 9/2004 | Sreenivasan et al. | |
| 2004/0192041 A1 | 9/2004 | Jeong et al. | |
| 2004/0197843 A1 | 10/2004 | Chou et al. | |
| 2004/0200411 A1 | 10/2004 | Willson et al. | |
| 2004/0202865 A1 | 10/2004 | Homola et al. | |
| 2004/0209177 A1 | 10/2004 | Sreenivasan et al. | |
| 2004/0211754 A1 | 10/2004 | Sreenivasan et al. | |
| 2004/0251775 A1 | 12/2004 | Choi et al. | |
| 2005/0051698 A1 | 3/2005 | Sreenivasan et al. | |
| 2005/0064344 A1 | 3/2005 | Bailey et al. | |
| 2005/0084804 A1 | 4/2005 | Truskett et al. | |
| 2005/0098534 A1 | 5/2005 | Sreenivasan et al. | |

FOREIGN PATENT DOCUMENTS

| | | |
|---|---|---|
| DE | 19648844 | 9/1997 |
| EP | 244884 | 3/1987 |
| EP | 733455 | 9/1996 |
| EP | 0867775 | 9/1998 |
| JP | 55-88332 | 7/1980 |
| JP | 57-7931 | 1/1982 |
| JP | 58-129074 | 8/1983 |
| JP | 63-138730 | 6/1988 |
| JP | 1-196749 | 8/1989 |
| JP | 02-24848 | 1/1990 |
| JP | 02-92603 | 4/1990 |
| JP | 02192045 | 7/1990 |
| JP | 4-70379 | 5/1992 |
| WO | WO 87/02935 | 5/1987 |
| WO | WO 92/17883 | 10/1992 |
| WO | WO 98/10121 | 3/1998 |
| WO | WO 99/05724 | 2/1999 |
| WO | WO 99/45753 | 9/1999 |
| WO | WO 99/63535 | 12/1999 |
| WO | WO 00/21689 | 4/2000 |
| WO | WO 00/54107 | 9/2000 |
| WO | WO 01/33232 | 5/2001 |
| WO | WO 01/33300 | 5/2001 |
| WO | WO 01/47003 A2 | 6/2001 |
| WO | WO 01/53889 | 7/2001 |
| WO | WO 01/63361 | 8/2001 |
| WO | WO 01/69317 | 9/2001 |
| WO | WO 01/79589 | 10/2001 |
| WO | WO 01/79591 | 10/2001 |
| WO | WO 01/79592 | 10/2001 |
| WO | WO 01/79933 | 10/2001 |
| WO | WO 01/90816 | 11/2001 |
| WO | WO 02/006902 | 1/2002 |
| WO | WO 02/07199 | 1/2002 |
| WO | WO 02/008835 | 1/2002 |
| WO | WO 02/17383 | 2/2002 |
| WO | WO 02/22916 | 3/2002 |
| WO | WO 02/24977 | 3/2002 |
| WO | WO 02/067055 | 8/2002 |
| WO | WO 03/010289 | 2/2003 |
| WO | WO 03/079416 | 9/2003 |
| WO | WO 03/099536 | 12/2003 |
| WO | WO 2004/114016 | 12/2004 |

OTHER PUBLICATIONS

Abstract of Japanese Patent 02-92603, Aug. 12, 2004.
Abstract of Japanese Patent 55-88332, Apr. 14, 2004.
Abstract of Japanese Patent 57-7931, Apr. 14, 2004.
Abstract of Japanese Patent 58-129074, Aug. 1, 1983.
Abstract of Japanese Patent 63-138730, Apr. 14, 2004.
Ananthasuresh et al., "Strategies for Systematic Synthesis of Compliant Mems.", DSC-vol. 55-2, Dynamic Systems and Control: vol. 2, pp. 677-686, Nov. 1, 1994.
Arai et al., "Calibration and Basic Motion of Micro Hand Module.", IEEE, Jan. 1, 1993, pp. 1660-1665.
Arai et al., "Development of a New Parallel Manipulator with Fixed Linear Actuator.", In Proceedings of Japan/USA Symposium on Flexible Automation, Jan. 1, 1996, vol. 1, ASME, New York, pp. 145-149.
"Photoresist Coating Methods.", E-mail from Susan Bagen (BAGEN@aol.com) to Dhaval Shah, Sep. 18, 1997.
Bender et al., "Fabrication of Nanostructures using a UV-based Imprint Technique.", Microelectronic Engineering 53, Jan. 1, 2000, pp. 233-236.
Bender et al., "Multiple Imprinting in UV-based Nanoimprint Lithography: Related Material Issues.", Microelectronic Engineering 61-62, Jan. 1, 2002, pp. 407-413.
Blomquist et al., "Fluorinated Acrylates in making Low-Loss, Low-Birefringence, and Single-Mode Optical Waveguides with Exceptional Thermo-Optic Properties.", SPIE Conference on Linear Optical Properties of Waveguides and Fibers, Jul. 1, 1999, vol. 3799, pp. 266-279.
Braeuer et al., "Precise Polymer Micro-Optical Systems.", MRS Bulletin, Jul. 1, 2001, pp. 519-522.
Choi et al., "Design of Orientation Stages for Step and Flash Imprint Lithography.", Precision Engineering, Jan. 1, 2001, pp. 192-199.
Chou et al., "Imprint Lithography with 25-Nanometer Resolution." Science vol. 272, Apr. 5, 1996, pp. 85-87.
Chou et al., "Imprint Lithography with Sub-10 nm Feature Size and High Throughput.", Microelectronic Engineering 35, Jan. 1, 1997, pp. 237-240.
Chou et al., "Imprint of Sub-25 nm Vias and Trenches in Polymers.", Applied Physics Letter, Nov. 20, 1995, 67 (21).
Chou et al., "Lithographically Induced Self-assembly of Periodic Polymer Micropillar Arrays.", J. Vac. Sci. Technol., Nov. 1, 1999, B 17(6), pp. 3197-3202.
Chou et al., "Nanoimprint Lithography and Lithographically Induced Self-Assembly.", MRS Bulletin, Jul. 1, 2001, pp. 512-517.
Chou, Ultrafast and Direct Imprint of Nanostructures in Silicon, Nature, col. 417, (Jun. 2002), pp. 835-837.
Colburn et al., "Step and Flash Imprint Lithography for sub-100 nm Patterning.", Proceedings of SPIE, Jan. 1, 2000, vol. 3997, pp. 453-457.
Colburn et al., "Step and Flash Imprint Lithography: A New Approach to High-Resolution Patterning.", Proc of SPIE, vol. 3676.

Cowie, "Polymers: Chemistry and Physics of Modern Materials.", 2nd Ed., Jan. 1, 1991, pp. 408-409.
Eldada et al., "Advanced Polymer Systems for Optoelectronic Integrated Circuit Applications.", SPIE, Jan. 1, 1997, vol. 3006, pp. 344-361.
Eldada et al., "Affordable WDM Components: The Polymer Solution.", SPIE, Jan. 1, 1998, vol. 3234, pp. 161-174.
Eldada et al., "Robust Photopolymers for MCM, Board, and Backplane Optical Interconnects.", SPIE, Jan. 1, 1998, vol. 3288, pp. 175-191.
Feldman et al., "Wafer Chuck Magnification Correction in X-Ray Lithography.", J. Vac. Sci. Technol. B 16(6), Nov. 1, 1998, pp. 3476-3479.
Feynman, "There's Plenty of Room at the Bottom." Dec. 1959.
Gokan et al., "Dry Etch Resistance of Organic Materials.", J. Electrochem. Soc.: Solid-State Science and Technology, Jan. 1, 1983, pp. 143-146.
Goldfarb et al., "A Well-Behaved Revolute Flexure Joint for Compliant Mechanism Design.", ASME Journal of Mechanical Design, Sep. 1, 1999, vol. 121, No. 3, pp. 424-429.
Goldfarb et al., "Compliant Micromanipulator Design for Scaled Bilateral Telemanipulation of Small-Scale Environments.", ASME International Mechanical Engineering Conference and Exposition, Nov. 1, 1998, DSC-vol. 64, pp. 213-218.
Haisma et al., "Mold-assisted Nanolithography: A Process for Reliable Pattern Replication.", J. Vac. Sci. Technol. B, Nov. 1, 1996, pp. 4124-4128.
Hashimoto et al., "Design and Characteristics of a Parallel Link Compliant Wrist." IEEE, May 1, 1994, Department of Mechanical Engineering, Kagoshiam University, pp. 2457-2462.
Heidari, "Nanoimprint Lithography at the 6 in. Wafer Scale.", J. Vac. Sci. Technol. B 18 (6), Nov. 1, 2000, pp. 3557-3560.
Hexapods, "G1000-PS Power Series", www.hexapods.com., Oct. 12, 1999.
Hexel Coporation, "Tornado 2000 System Specifications.", www.hexel.com, Nov. 12, 1999.
Hirai et al., "Abstract of Mold Surface Treatment for Imprint Lithography", Journal of Photopolymer Science and Technology, Aug. 28, 2001, pp 457-462, vol. 14, No. 3.
Hirai et al., "Mold Surface Treatment for Imprint Lithography.", Journal of Photopolymer Science and Technology, Aug. 1, 2001, vol. 14, No. 3, pp. 457-462.
Hogan et al., "Impedance Control: An Approach to Manipulation: Part 1- Theory.", Journal of Dynamic Systems, Measurement, and Control, Mar. 1, 1985, vol. 107, pp. 1-7.
Hollis et al., "A Six-Degree-of-Freedom Magnetically Levitated Variable Compliance Fine-Motion Wrist: Design, Modeling, and Control.", IEEE Transactions on Robotics and Automation, Jun. 1, 1991, vol. 7., No. 3, pp. 320-332.
Howell et al., "A Loop-Closure Theory for the Analysis and Synthesis of Compliant Mechanisms.", Journal of Mechanical Design, Mar. 1, 1996, vol. 188, pp. 121-125.
Hu et al., "Fluorescence Probe Techniques (FPT) for Measuring the Relative Efficiencies of Free-Radical Photoinitiators.", Macromolecules, May 29, 1998, 31, pp. 4107-4113.
International Search Report for PCT/US 00/30041, Oct. 18, 2001.
International Search Report for PCT/US 01/26049, Feb. 19, 2002.
Johnson et al., "Advances in Step and Flash Imprint Lithography.", SPIE Microlithography Conference, Feb. 23, 2003.
Kanetomo et al., "Robot for Use in Ultrahigh Vacuum.", Solid State Technology, Aug. 1, 1997, pp. 63-72.
Kim et al., "High-precision Magnetic Levitation Stage for Photolithography.", Precision Engineering, Apr. 1, 1998, vol. 22., No. 2, pp. 66-77.
Kim et al., "Surface Energy and Polarity of Treated Indium-Tin-Oxide Anodes for Polymer Light-Emitting Diodes Studied by Contact Angle Measurements.", Journal of Applied Physics, 1999, pp. 2774-2778, vol. 86, No. 5.
Koseki, "Design and Accuracy Evaluation of High-Speed and High Precision Parallel Mechanism.", Proc. Of IEEE, Jan. 1, 1998, Intl. Conf. on Robotics & Automation, pp. 1340-1345.

Kotachi et al., "Si-Containing Positive Resist for ArF Excimer Laser Lithography.", Photopolymer Science and Technology, Nov. 4, 1995, pp. 615-622.
Krauss et al., "Fabrication of Nanodevices Using Sub-25 nm Imprint Lithography.", Appl. Phy. Lett., Jan. 1, 1995, 67 (21), pp. 3114-3116.
Krug et al., "Fine Patterning of Thin Sol-get Films.", Journal of Non-Crystalline Solids, Jan. 1, 1992, 147 & 148, pp. 447-450.
Kumar et al., "Features of Gold Having Micrometer to Centimeter Dimensions can be Formed Through a Combination of Stamping with an Elastomeric Stamp and an Alkanethiol "ink" followed by Chemical Etching.", Applied Physics Letters, Oct. 4, 1993, vol. 63, Issue 14, pp. 2002-2004.
Lee et al., "An Ultraprecision Stage for Alignment of Wafers in Advanced Microlithography.", Precision Engineering, Sep. 1, 1997, pp. 113-122.
Lee et al., "Ultra Precision Positioning System for Servo Motor-piezo Actuator Using the Dual Servo Loop and Digital filter Implementation.", American Society for Precision Engineering, Jan. 1, 1998, pp. 287-290.
Lin, "Multi-Layer Resist Systems.", Introduction to Microlithography, Feb. 14, 1983, pp. 287-349.
Lucas Aerospace, Free-Flex ® Pivot Catalog, Jan. 1, 1999.
Luurtsema, "Spin Coating for Rectangular Substrates.", Retrieved May 23, 2002 from URL: http://buffy.eecs.berkelye.edu/IRO/Summary/97abstracts/gluurts.2.html, May 23, 1992.
Mansky et al., "Large-Area Domain Alignment in Block Copolymer Thin Films Using Electric Fields.", Macromolecules, Jun. 9, 1998, vol. 31, No. 13, pp. 4399-4401.
Martin et al., "Predication of Fabrication Distortions in Step and Flash Imprint Lithography Templates.", Journal of Vacuum Science. B 20(6) pp. 2891-2895, Nov. 1, 2002.
Merlet, "Parallel Manipulators: State of the Art and Perspectives.", Advanced Robotics, Jan. 1, 1994, vol. 8, pp. 589-596.
Mirkin et al., "Emerging Methods for Micro-and-Nanofabrication.", MRS Bulletin, Jul. 1, 2001, pp. 506-509.
Mitsui et al., "Application of Two-Wavelength Optical Heterodyne Alignment System in XS-1.", Part of the SPIE Conference on Emerging Lithographic Technologies III, Mar. 1, 1999, SPIE vol. 3676, pp. 455-464.
Mittal, "Precision Motion Control of a Magnetic Suspension Actuator Using a Robust Nonlinear Compensation Scheme.", IEE/ASME Transactions on Mechatronics., Dec. 1, 1997, vol. 2., No. 4, pp. 268-280.
Nerac.com Retro Search, "Imprint Lithography." Oct. 16, 2004.
Nerac.com Retro Search, "Multi-Layer Resists.", Sep. 2, 2004.
Nerac.com Retro Search, "Reduction of Dimension of Contact Holes.", Aug. 31, 2004.
Nerac.com Retro Search, "Trim Etching of Features Formed on an Organic Layer.", Sep. 2, 2004.
Nguyen, "Asymmetric Fluid-Structure Dynamics in Nanoscale Imprint Lithography." The University of Texas at Austin, Aug. 1, 2001, pp. 1-111.
Ohya et al., "Development of 3-DOF Finger Module for Micro Manipulation.", Proc. of IEEE, Mar. 1, 1999, Intl. Conf. on Intelligent Robots and Systems, pp. 894-899.
Otto et al., "Characterization and Application of a UV-based Imprint Technique.", Microelectronic Engineering 57-58, Jan. 1, 2001, pp. 361-366.
Papirer et al., "Abstract of The Grafting of Perfluorinated Silanes onto the Surface of Silica: Characterization by Inverse Gas Chromatography.", Journal of Colloid and Interface Science 159, Aug. 1, 1993, pp. 238-242.
Parikh et al., "An Intrinsic Relationship between Molecular Structure in Self-Assembled n-Alkylsiloxane Monolayers and Deposition Temperature.", Journal of Phys. Chem., Jul. 1, 1994, pp. 7577-7590.
Paros et al., "How to design Flexure Hinges.", Machine Design, Nov. 25, 1965, pp 151-156.
Peng et al., "Compliant Motion Control of Kinematically Redundant Manipulators.", IEEE Transactions on Robotics and Automation, Dec. 1, 1993, vol. 9, No. 6, pp. 831-837.
Pernette et al., "Design of Parallel Robots in Microbotics.", Robotica, Jan. 1, 1997, vol. 15, pp 417-420.

Physik Instruments, "Hexapod Six-Axis Parallel Kinematics Robot", Nano Positioning, Jan. 1, 1998, pp. 8.4-8.5.

Physik Instruments, "NanoPositioning, MicroPositioning, Piezo Technology.", PI Online Catalog, Jan. 1, 1999, www.physikinstruments.com.

Raibert et al., "Hybrid Position/Force Control of Manipulators.", Journal of Dynamic Systems, Measurement, and Control, Jun. 1, 1981, vol. 102, pp. 126-133.

Rong et al., "Design and Analysis of Flexure-Hinge Mechanism Used in Micro-Positioning Stages.", ASME, Jan. 1, 1994, vol. 2, pp. 979-985.

Rong et al., "Dynamics of Parallel Mechanism with Direct Compliance Control.", IEEE, Jan. 1, 1997, pp. 1753-1758.

Roos et al., "Abstract of Nanoimprint Lithography with a Commercial 4 Inch Bond System for Hot Embossing", Proceedings of SPIE, Oct. 1, 2001, vol. 4343, pp. 427-435.

Roos et al., "Nanoimprint Lithography with a Commercial 4 Inch Bond System for Hot Embossing.", Proceedings of SPIE, Oct. 1, 2001, vol. 4343, pp. 427-435.

Ruchhoeft et al., "Patterning Curved Surfaces: Template Generation by Ion Beam Proximity Lithography and Relief Transfer by Step and Flash Imprint Lithography.", Journal of Vacuum Science and Technology, pp. 1-17, Nov. 12, 1999.

Sagiv, "Organized Monolayers by Absorption. 1. Formation and Structure of Oleophobic Mixed Monolayers on Solid Surfaces.", Journal of American Chemical Society/102:1, Jan. 2, 1980.

Scheer et al., "Problems of the Nanoimprinting Technique for Nanometer Scale Pattern Definition.", J. Vac. Sci. Techno. B., Nov. 1, 1998, pp. 3917-3921.

Slocum, "Precision Machine Design: Macromachine Design Philosophy and Its Applicability to the Design of Micromachines.", Micro Electro Mechanical Systems, Feb. 4, 1992.

Sowah, "Diamond Used to Break the Mould [online].", [Retrieved on Sep. 2, 2003.] Retried from the Internet: <URL: http: HTTP://eetuk.com/showArticle,jhtml?articleID=19203691>., Sep. 18, 2002.

Srinivasan et al., "Alkyltrichlorosilane-Based Self-Assembled Monolayer Films for Stiction Reduction in Silicon Micromachines. " , Journal of Microelectromechanical Systems, Jun. 1, 1998, vol. 7, No. 2, p. 252-260.

Stewart, "A Platform With Six Degrees of Freedom.", Proc Instn Mech Engrs, May 28, 1965, vol. 180, P11, No. 15, pp. 371-378.

Stix, "Getting More from Moores", Scientific American, Apr. 2001.

Tajbakhsh et al., "Three-Degree-of-Freedom Optic Mount for Extreme Ultraviolet.", American Society for Precision Engineering, Jan. 1, 1998, pp. 359-362.

Tanikawa et al., "Development of Small-sized 3 DOF Finger Module in Micro Hand for Micro Manipulation.", Proc. of IEEE, Mar. 1, 1999, Intl. conf. on Intelligent Robots and Systems, pp. 876-881.

Tomita et al., "A 6-axes Motion Control Method for Parallel-Linkage-Type Fine Motion Stage.", JSPE-58-04, pp. 118-124., Nov. 11, 2002.

Translation of Japanese Patent 02-24848, Jan. 26, 1990.

Translation of Japanese Patent 02-92603, Apr. 3, 1990.

Trilogy Systems, "Linear Motors 310.", wwww.trilogysystems.com, Jan. 1, 2001.

Uchida et al., "A Mask-to-Wafer Alignment and Gap Setting Method for X-ray Lithography Using Graftings.", Journal Vacuum Science Technology, Nov. 1, 1991, B 9 (6), pp. 3202-3206.

U.S. Appl. No. 09/698,317, filed Oct. 27, 2000, Choi et al., "High Precision Orientation Alignment and Gap Control Stages for Imprint Lithography Processes.".

U.S. Appl. No. 10/463,396, filed Jun. 17, 2003, Choi et al., "Method to Reduce Adhesion Between a Conformable Region and a Pattern of a Mold.".

U.S. Appl. No. 10/614,716, filed Jul. 7, 2003, Sreenivasan et al., "A Conforming Template for Patterning Liquids Disposed on Substrates.".

U.S. Appl. No. 10/687,519, filed Oct. 16, 2003, Truskett et al., "Low Surface Energy Templates.".

U.S. Appl. No. 10/687,562, filed Oct. 16, 2003, Cherala et al., "Applying Imprinting Material to Substrates Employing Electromagnetic Fields.".

U.S. Appl. No. 10/760,821, filed Jan. 20, 2004, Sreenivasan et al., "Method for Concurrently Employing Differing Materials to Form a Substrate.".

U.S. Appl. No. 10/785,248, filed Feb. 24, 2004, Choi et al., "A Method to Control the Relative Position Between a Body and a Surface.".

U.S. Appl. No. 10/788,700, filed Feb. 27, 2004, Sreenivasan et al., "Full-Wafer or Large Area Imprinting with Multiple Separated Sub-Fields for High Throughput Lithography.".

U.S. Appl. No. 10/864,214, filed Jun. 9, 2004, Sreenivasan et al., "An Imprint Lithography System to Produce a Light to Impinge upon and Polymerize a Liquid in Superimposition with Template Overlay Marks.".

U.S. Appl. No. 10/616,294, filed Jul. 9, 2003, Choi et al., "Systems for Magnification and Distortion Correction for Imprint Lithography Processes.".

Vanderbilt, "VU9730 Specifications for Improved Flexure Device.", Vanderbilt University Office of Transfer Technology, 101, 25, 192-199, Jan. 1, 2003.

Wang et al., "Passive Compliance versus Active Compliance in Robot-Based Automated Assembly Systems.", Industrial Robot, Jan. 1, 1998, vol. 25, No. 1, pp. 48-57.

White et al., "Novel Alignment System for Imprint Lithography.", J. Vac. Sci. Technol. B 18(6), Nov. 1, 2000, pp. 3552-3556.

Williams et al., "Six Degree of Freedom Mag-Lev Stage Development.", SPIE, Jan. 1, 1997, vol. 3051, pp. 856-867.

Wu, "Large Area High Density Quantized Magnetic Disks Fabricated Using Nanoimprint Lithography.", J. Vac. Sci. Technol., Nov. 1, 1998, B 16(6), pp. 3825-3829.

Xia et al., "Soft Lithography.", Angew. Chem. Int. Ed., Jan. 1, 1998, pp. 551-575.

Xia et al., "Soft Lithography.", Annu Rev. Mater. Sci., 1998, 28: 153-184.

Chou et al., Nanoimprint Lithography, Journal of Vacuum Science Technolgoy B 14(16), pp. 4129-4133, Nov. 1, 1996.

Colburn et al., Development and Advantages of Step-and-Flash Lithography, Solid State Technology, Jul. 1, 2001.

Resnick et al., High Resolution Templates for Step and Flash Imprint Lithography, Journal of Microlithography, Microfabrication, and Microsystems. vol. 1. No. 3., Oct. 1, 2002.

Colburn et al., Characterization and Modeling of Volumetric and Mechanical Properties for Step and Flash Imprint Lithography Photopolymers, Journal of Vacuum Science Technology. vol. b. 19(6), Nov. 1, 2001.

Bailey et al., Step and Flash Imprint Lithography: Defect Analysis, Journal of Vacuum Science, B 19(6), pp. 2806-2810, Nov. 1, 2001.

Bailey et al., Step and Flash Imprint Lithography: Template Surface Treatment and Defect Analysis, Journal of Vacuum Science, B 18(6), pp. 3572-3577, Nov. 1, 2000.

Wronosky et al., Wafer and Reticle Positioning System for the Extreme Ultraviolet Lithography Engineering Test Stand, Emerging Lithography Technologies, Proceedings of SPIE vol. 3997, pp. 829-839, Jul. 1, 2000.

Schneider et al., Stripes of Partially Fluorinated Alkyl Chains: Dipolar Langmuir Monolayers.

Shibuichi et al., Super Water- and Oil-Repellent Surfaces Resulting from Fractal Structure, Journal of Colloid and Interface Science, vol. 208, No. 1, pp. 287-294 Dec. 1, 1998.

U.S. Appl. No. 10/833,240, naming Inventors Watts et al., entitled Compliant Template for UV Imprinting, filed Apr. 27, 2004.

U.S. Appl. No. 10/895,214, naming Inventors Voison, entitled Imprint Alignment Method, System, and Template, filed Jul. 20, 2004.

U.S. Appl. No. 10/917,761, naming Inventors McMackin et al., entitled A. Moat System for an Imprint Lithography Template, filed Aug. 13, 2004.

U.S. Appl. No. 11/051,941, naming Inventors McMackin et al., entitled Imprint Lithography Template to Facilitate Control of Liquid Movement, filed Feb. 4, 2005.

U.S. Appl. No. 11/000,321, naming Inventors Nimmakayala et al., entitled Interferometric Analysis Method for the Manufacture of Nano-Scale Devices, filed Nov. 30, 2004.

Park et al., Aligning Liquid Crystals Using Replicated Nanopatterns, PSI Scientific Report 2002, vol. VII, p. 85 Mar. 1, 2003.

Taniguchi et al., Diamond Nanoimprint Lithography, Nanotechnology, 2002, vol. 13, No. 5, pp. 592-596(5) Jan. 1, 2002.

Kiyohara et al., Abstract of Plasma Etching of CVD Diamond Films using an ECR-type Oxygen Source, http://www.iop.org/EJ/abstract/0957-4484/10/4/304 Sep. 26, 2003.

U.S. Appl. No. 11/136,897, naming Inventors Miller et al., entitled Imprint Lithography Template Having a Coating to Reflect and/or Absorb Actinic Energy, filed May 25, 2005.

* cited by examiner

IMPRINT LITHOGRAPHY TEMPLATE HAVING OPAQUE ALIGNMENT MARKS

BACKGROUND OF THE INVENTION

The field of invention relates generally to imprint lithography. More particularly, the present invention is directed to producing templates having alignment marks formed thereon.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al. Willson et al. disclose a method of forming a relief image in a structure. The method includes providing a substrate having a transfer layer. The transfer layer is covered with a polymerizable fluid composition. A mold makes mechanical contact with the polymerizable fluid. The mold includes a relief structure, and the polymerizable fluid composition fills the relief structure. The polymerizable fluid composition is then subjected to conditions to solidify and polymerize the same, forming a solidified polymeric material on the transfer layer that contains a relief structure complimentary to that of the mold. The mold is then separated from the solid polymeric material such that a replica of the relief structure in the mold is formed in the solidified polymeric material. The transfer layer and the solidified polymeric material are subjected to an environment to selectively etch the transfer layer relative to the solidified polymeric material such that a relief image is formed in the transfer layer. The time required and the minimum feature dimension provided by this technique are dependent upon, inter alia, the composition of the polymerizable material.

U.S. Pat. No. 5,772,905 to Chou discloses a lithographic method and an apparatus for creating ultra-fine (sub-25 nm) patterns in a thin film coated on a substrate in which a mold having at least one protruding feature is pressed into a thin film carried on a substrate. The protruding feature in the mold creates a recess of the thin film. The mold is removed from the film. The thin film then is processed such that the thin film in the recess is removed exposing the underlying substrate. Thus, patterns in the mold are replaced in the thin film, completing the lithography. The patterns in the thin film will be, in subsequent processes, reproduced in the substrate or in another material which is added onto the substrate.

Yet another imprint lithography technique is disclosed by Chou et al. in *Ultrafast and Direct Imprint of Nanostructures in Silicon*, Nature, Col. 417, pp. 835–837, June 2002, which is referred to as a laser assisted direct imprinting (LADI) process. In this process, a region of a substrate is made flowable, e.g., liquefied, by heating the region with the laser. After the region has reached a desired viscosity, a mold, having a pattern thereon, is placed in contact with the region. The flowable region conforms to the profile of the pattern and is then cooled, solidifying the pattern into the substrate.

A concern with each of the above-identified pattern formation processes relates to proper orientation of the template with the substrate. For example, it is desired to properly align the template with an existing patterned layer so that the proper orientation between the existing patterned layer and a subsequent patterned layer is obtained.

Thus, a need exists for producing a template having alignment marks for use with imprint lithographic techniques.

SUMMARY OF THE INVENTION

The present invention is directed to providing a template with alignment marks that are opaque to selective wavelength of light. In one embodiment, a template is provided having patterning areas and a template, with the template mark being formed from metal and disposed outside of the patterning areas. The alignment marks may be surrounded by a moat to prevent curable liquid from being in superimposition therewith during imprinting. In this manner, opaque alignment marks may be employed without degrading the quality of the pattern formed during imprinting. These and other embodiments are discussed more fully below.

DETAILED DESCRIPTION OF THE INVENTION

Figure 1:
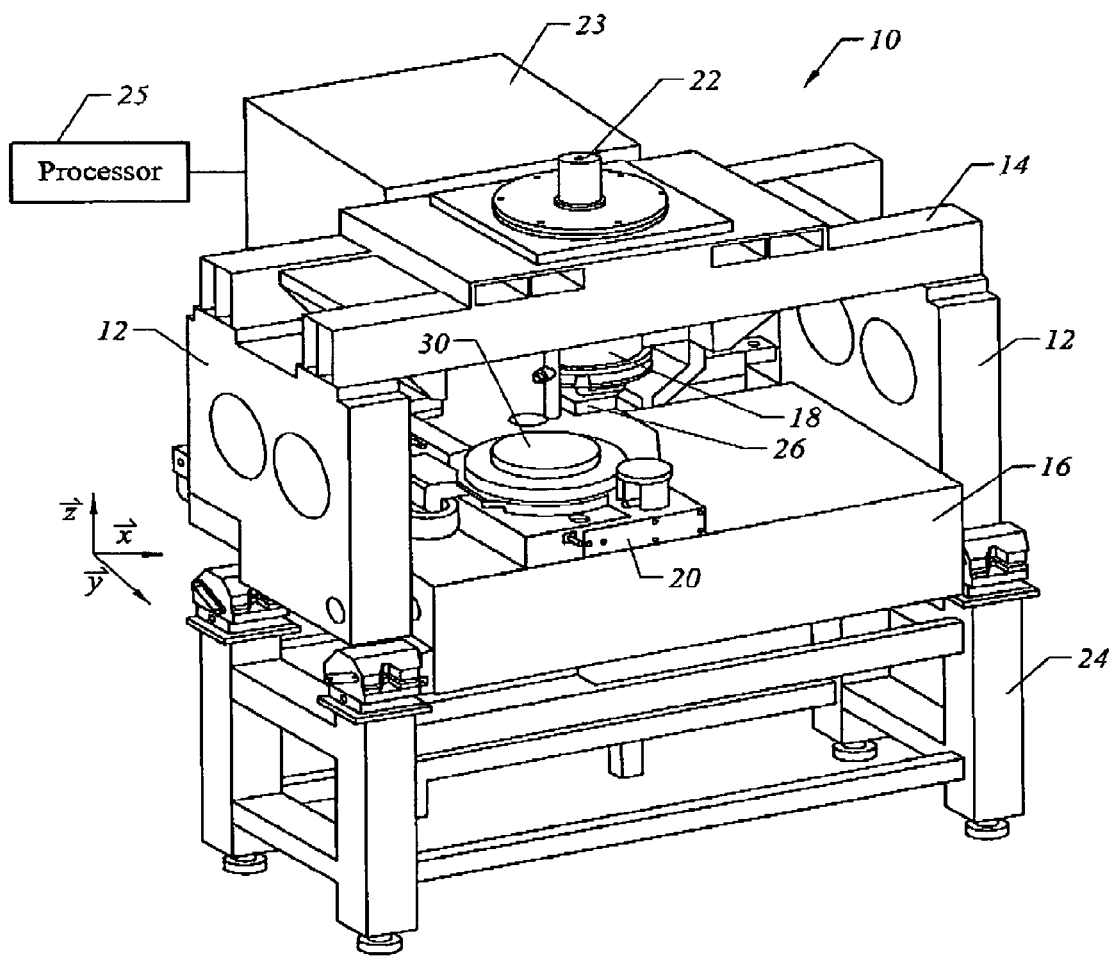
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16 and provides movement along the Z-axis. Disposed upon stage support 16 to face imprint head 18 is a motion stage 20. Motion stage 20 is configured to move with respect to stage support 16 along X- and Y-axes. It should be understood that imprint head 18 may provide movement along the X- and Y-axes, as well as the Z-axis, and motion stage 20 may provide movement in the Z-axis, as well as the X- and Y-axes. An exemplary motion stage device is disclosed in U.S. patent application Ser. No. 10/194,414, filed Jul. 11, 2002, entitled "Step and Repeat Imprint Lithography Systems," assigned to the assignee of the present invention, and which is incorporated by reference herein in its entirety. A radiation source 22 is coupled to lithographic system 10 to impinge actinic radiation upon motion stage 20. As shown, radiation source 22 is coupled to bridge 14 and includes a power generator 23 connected to radiation source 22. Operation of lithographic system 10 is typically controlled by a processor 25 that is in data communication therewith.

Figure 2:
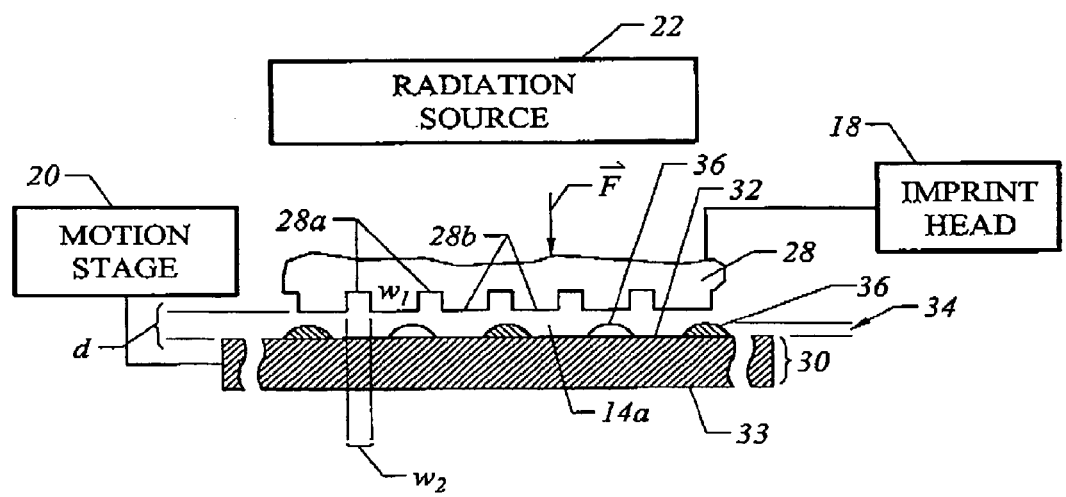
FIG. 2 is a simplified elevation view of a lithographic system shown in FIG. 1.

Referring to both FIGS. 1 and 2, connected to imprint head 18 is a template 26 having a mold 28 thereon. Mold 28 and/or template 26, may be formed from various conventional materials, such as, but not limited to, fused-silica, quartz, silicon, organic polymers, siloxane polymers, borosilicate glass, fluorocarbon polymers, metal, hardened sapphire and the like. Mold 28 includes a plurality of features defined by a plurality of spaced-apart recessions 28a and protrusions 28b. The plurality of features defines an original pattern that is to be transferred into a substrate 30 positioned on motion stage 20. To that end, imprint head 18 and/or motion stage 20 may vary a distance "d" between mold. 28 and substrate 30. In this manner, the features on mold 28 may be imprinted into a flowable region of substrate 30, discussed more fully below. Radiation source 22 is located so that mold 28 is positioned between radiation source 22 and substrate 30. As a result, mold 28 is fabricated from a material that allows it to be substantially transparent to the radiation produced by radiation source 22.

Figure 3:
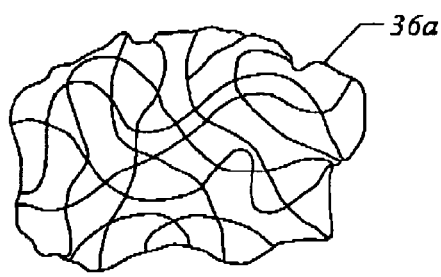
FIG. 3 is a simplified representation of material from which an imprinting layer, shown in FIG. 2, is comprised before being polymerized and cross-linked.

Referring to both FIGS. 2 and 3, a flowable region, such as an imprinting layer 34, is disposed on a portion of a surface 32 that presents a substantially planar profile. A flowable region may be formed using any known technique, such as a hot embossing process disclosed in U.S. Pat. No. 5,772,905, which is incorporated by reference in its entirety herein, or a laser assisted direct imprinting (LADI) process of the type described by Chou et al. in *Ultrafast and Direct Imprint of Nanostructures in Silicon, Nature*, Col. 417, pp. 835–837, June 2002. In the present embodiment, however, a flowable region consists of imprinting layer 34 being deposited as a plurality of spaced-apart discrete beads 36 of a material 36a on substrate 30, discussed more fully below. An exemplary system for depositing beads 36 is disclosed in U.S. patent application Ser. No. 10/191,749, filed Jul. 9, 2002, entitled "System and Method for Dispensing Liquids," and which is assigned to the assignee of the present invention, and which is incorporated by reference in its entirety herein. Imprinting layer 34 is formed from material 36a that may be selectively polymerized and cross-linked to record the original pattern therein, defining a recorded pattern. An exemplary composition for material 36a is disclosed in U.S. patent application Ser. No. 10/463,396, filed Jun. 16, 2003 and entitled "Method to Reduce Adhesion Between a Conformable Region and a Pattern of a Mold," which is incorporated by reference in its entirety herein. Material 36a is shown in FIG. 4 as being cross-linked at points 36b, forming a cross-linked polymer material 36c.

Figure 5:
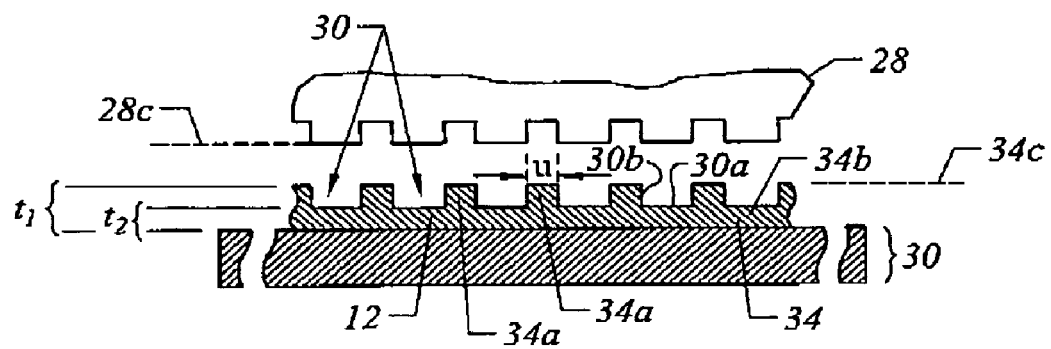
FIG. 5 is a simplified elevation view of a mold spaced-apart from the imprinting layer, shown in FIG. 1, after patterning of the imprinting layer.

Referring to FIGS. 2, 3 and 5, the pattern recorded in imprinting layer 34 is produced, in part, by mechanical contact with mold 28. To that end, distance "d" is reduced to allow imprinting beads 36 to come into mechanical contact with mold 28, spreading beads 36 so as to form imprinting layer 34 with a contiguous formation of material 36a over surface 32. In one embodiment, distance "d" is reduced to allow sub-portions 34a of imprinting layer 34 to ingress into and fill recessions 28a.

To facilitate filling of recessions 28a, material 36a is provided with the requisite properties to completely fill recessions 28a, while covering surface 32 with a contiguous formation of material 36a. In the present embodiment, sub-portions 34b of imprinting layer 34 in superimposition with protrusions 28b remain after the desired, usually minimum, distance "d", has been reached, leaving sub-portions 34a with a thickness $t_1$, and sub-portions 34b with a thickness $t_2$. Thicknesses "$t_1$" and "$t_2$" may be any thickness desired, dependent upon the application. Typically, $t_1$ is selected so as to be no greater than twice the width u of sub-portions 34a, i.e., $t_1 \leq 2u$, shown more clearly in FIG. 5.

Figure 4:
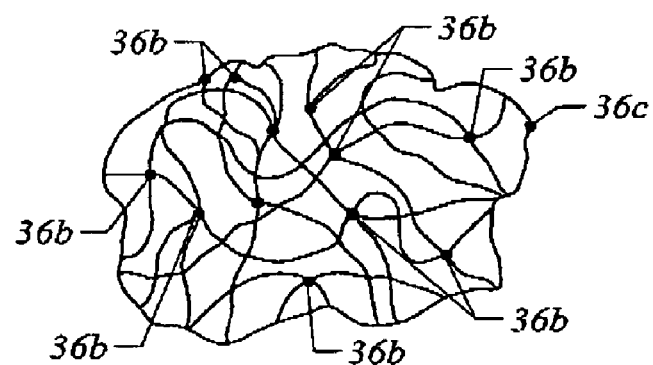
FIG. 4 is a simplified representation of cross-linked polymer material into which the material shown in FIG. 3 is transformed after being subjected to radiation.

Referring to FIGS. 2, 3 and 4, after a desired distance "d" has been reached, radiation source 22 produces actinic radiation that polymerizes and cross-links material 36a, forming cross-linked polymer material 36c. As a result, the composition of imprinting layer 34 transforms from material 36a to cross-linked polymer material 36c, which is a solid. Specifically, cross-linked polymer material 36c is solidified to provide side 34c of imprinting layer 34 with a shape conforming to a shape of a surface 28c of mold 28, shown more clearly in FIG. 5. After imprinting layer 34 is transformed to consist of cross-linked polymer material 36c, shown in FIG. 4, imprint head 18, shown in FIG. 2, is moved to increase distance "d" so that mold 28 and imprinting layer 34 are spaced-apart.

Figure 6:
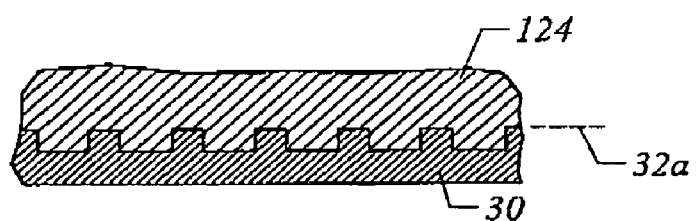
FIG. 6 is a simplified elevation view of an additional imprinting layer positioned atop of the substrate, shown in FIG. 5, after the pattern in the first imprinting layer is transferred therein.

Referring to FIG. 5, additional processing may be employed to complete the patterning of substrate 30. For example, substrate 30 and imprinting layer 34 may be etched to transfer the pattern of imprinting layer 34 into substrate 30, providing a patterned surface 32a, shown in FIG. 6. To facilitate etching, the material from which imprinting layer 34 is formed may be varied to define a relative etch rate with respect to substrate 30, as desired. The relative etch rate of imprinting layer 34 to substrate 30 may be in a range of about 1.5:1 to about 100:1.

Alternatively, or in addition to, imprinting layer 34 may be provided with an etch differential with respect to photo-resist material (not shown) selectively disposed thereon. The photo-resist material (not shown) may be provided to further pattern imprinting layer 34, using known techniques. Any etch process may be employed, dependent upon the etch rate desired and the underlying constituents that form substrate 30 and imprinting layer 34. Exemplary etch processes may include plasma etching, reactive ion etching, chemical wet etching and the like.

To form an additional imprinting layer, such as a layer 124 atop of surface 32a, correct placement of mold 28 with respect to substrate 30 is important. To that end, overlay alignment schemes may include alignment error measurement and/or alignment error compensation and/or placement error measurement and correction. Placement error, as used herein, generally refers to X-Y positioning errors between a template and a substrate (that is, translation along the X- and/or Y-axis). Placement errors, in one embodiment, are determined and corrected for by using an optical imaging system 40, shown in FIG. 7, to sense alignment marks discussed below with respect to FIG. 8.

Figure 7:
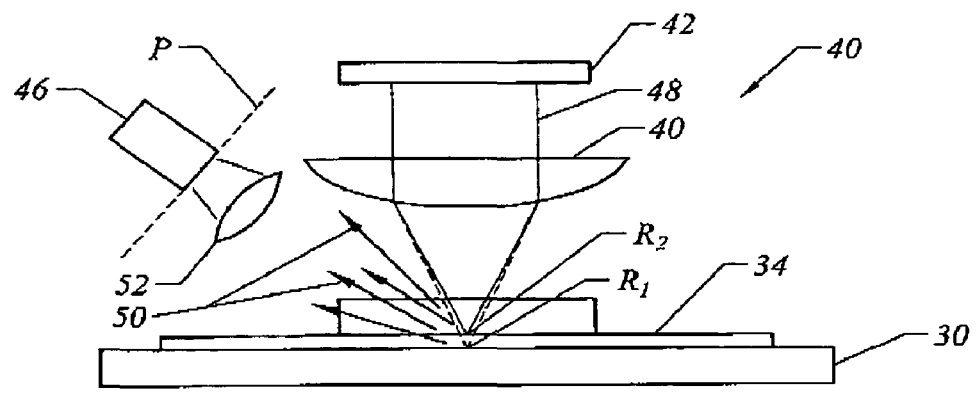
FIG. 7 is a plan view of an imaging system employed to sense alignment marks.

Referring to FIG. 7, optical imaging system 40 includes a light source 42 and an optical train 44 to focus light upon substrate 30. Optical imaging system 40 is configured to focus alignment marks lying in differing focal planes onto a single focal plane, P, wherein an optical sensor 46 may be positioned. As a result, optical train 44 is configured to provide wavelength-dependent focal lengths. Differing wavelengths of light may be produced in any manner known in the art. For example, a single broadband source of light, shown as a light 48, may produce wavelengths that impinge upon optical train 44. Optical band-pass filters (not shown) may be disposed between the broadband source and the alignment marks (not shown). Alternatively, a plurality of sources of light (not shown) may be employed, each one of which produces distinct wavelengths of light. Light 48 is focused by optical train 44 to impinge upon alignment marks (not shown) at one or more regions, shown as region $R_1$ and region $R_2$. Light reflects from regions $R_1$ and $R_2$, shown as a reflected light 50, and is collected by a collector lens 52. Collection lens 52 focuses all wavelengths of reflected light 50 onto plane P so that optical sensor 46 detects reflected light 50.

Figure 8:
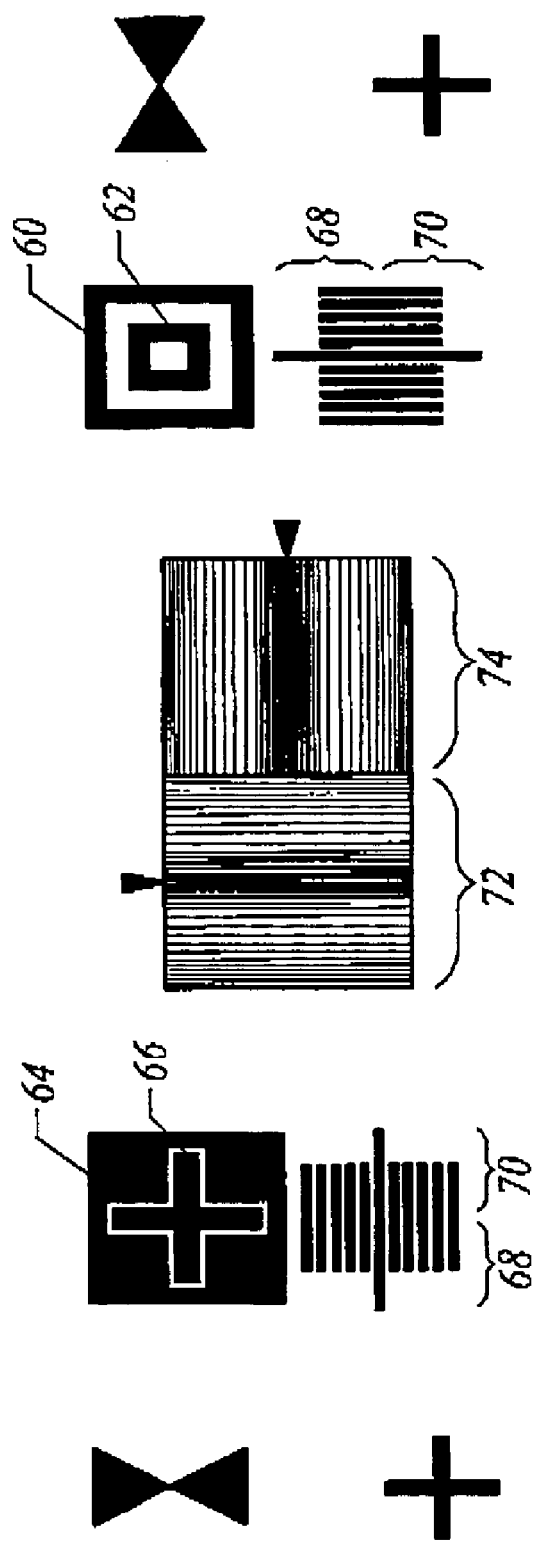
FIG. 8 is a plan view of alignment marks employed in accordance with the present invention.

Referring to FIGS. 1 and 8, alignment marks may be of many configurations and are arranged in pairs with one of the alignment marks of the pair being disposed on template 26 and the remaining alignment mark being positioned on substrate 30, typically in a previously deposited imprinting layer. For example, alignment marks may include first and second polygonal marks 60 and 62, depicted as squares, but may be any polygonal shape desired. Another configuration for alignment marks are shown as crosses, shown as 64 and 66. Also additional alignment marks may be employed, such as vernier marks 68 and 70, as well as Moiré gratings, shown as 72 and 74.

Wavelengths are selected to obtain a desired focal length, depending upon the gap between mold 28 and substrate 30. Under each wavelength of light used, each overlay mark may produce two images on the imaging plane. A first polygonal alignment mark 60, using a specific wavelength of light, presents as a focused image on sensor 46. A second polygonal alignment mark 62, using the same wavelength of light, presents as an out-of-focus image on sensor 46. In order to eliminate each out-of-focus image, several methods may be used.

Figure 9:
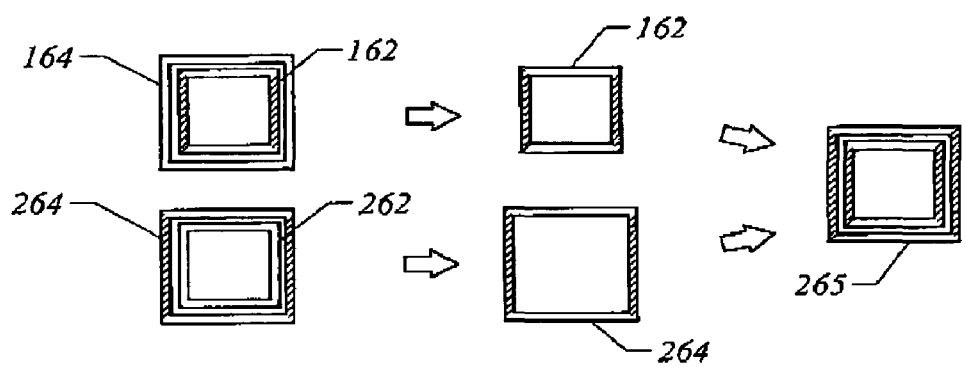
FIG. 9 is a plan view of alignment marks employed in accordance with an alternate embodiment of the present invention.

Referring to FIGS. 7 and 9, in a first method, under illumination with a first wavelength of light, two images may be received by an imaging device, such as sensor 46, sensing first and second polygonal marks 162 and 164. Assuming polygonal mark 162 is focused and polygonal mark 164 is out-of-focus. An image processing technique may be used to remove geometric data corresponding to pixels associated with polygonal mark 164. Thus, the out-of-focus polygonal mark of the substrate mark may be eliminated, leaving only polygonal mark 162. Using the same procedure and a second wavelength of light, polygonal marks 262 and 264 may be sensed by sensor 46. One of the polygonal marks 262 and 264 is not focused by collection lens 52 on sensor 46, shown a polygonal mark 262, but polygonal mark 264 is focused onto sensor 46. As before, geometric data associated with polygonal mark 262 is removed, leaving only geometric data associated with polygonal mark 264. Thereafter, polygonal marks 162 and 264 are superimposed forming alignment marks 265 to ascertain alignment between template and substrate.

Figure 10:
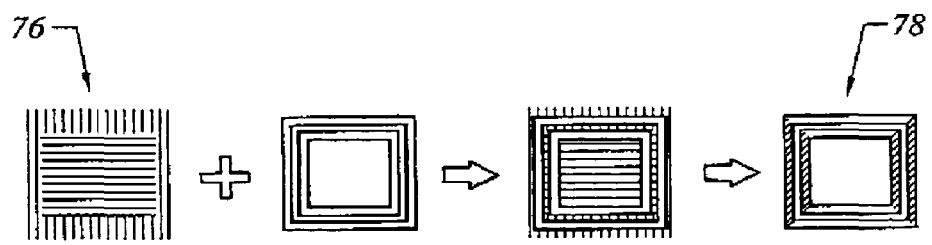
FIG. 10 is a plan view of alignment marks employed in accordance with a second alternate embodiment of the present invention.

A second method may utilize two coplanar polarizing arrays, shown in FIG. 10, and polarized illumination sources. Alignment marks may include orthogonally polarizing arrays 76. Polarizing arrays 78 are formed on a surface of mold 28 or placed above the surface. Under two polarized illumination sources, only focused images 78 (each corresponding to a distinct wavelength and polarization) may appear on an imaging plane. Thus, out-of-focus images are filtered out by polarizing arrays 76. An advantage of this method may be that it may not require an image processing technique to eliminate out-of-focus images.

Figure 11:
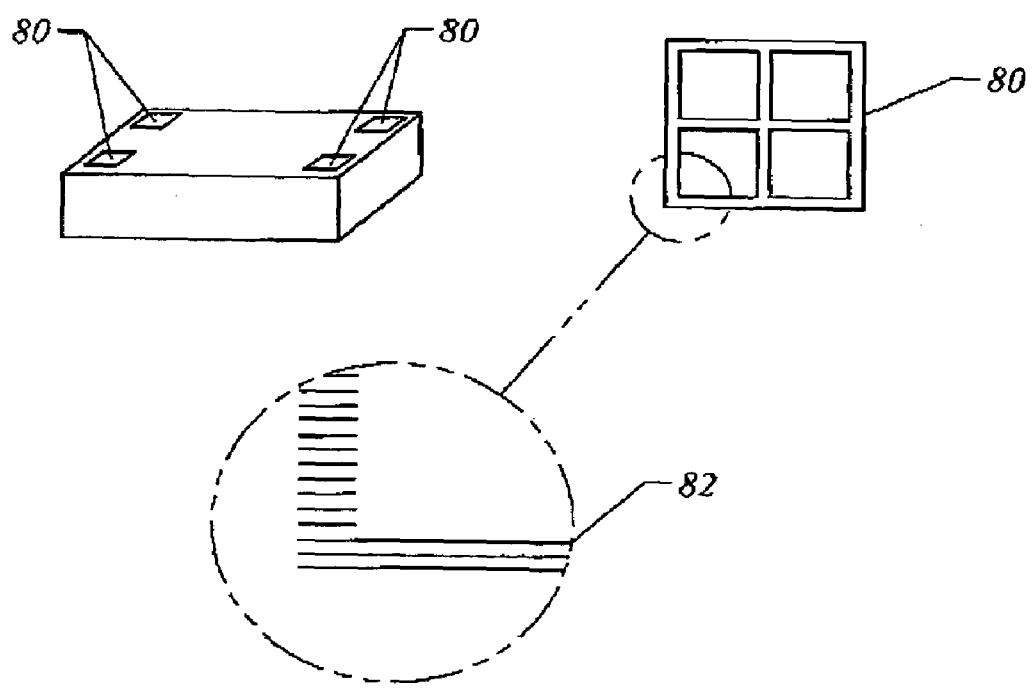
FIG. 11 is a plan view showing alignment marks disposed on a template, shown in FIG. 1.

Referring to FIGS. 1 and 11, Moiré pattern based overlay measurement has been used for optical lithography processes. For imprint lithography processes, where two layers of Moiré patterns are not on the same plane but still overlap in the imaging array, acquiring two individual focused images may be difficult to achieve. However, carefully controlling the gap between template 26 and substrate 30 within the depth of focus of the optical measurement tool and without direct contact between template 26 and substrate 30 may allow two layers of Moiré patterns to be simultaneously acquired with minimal focusing problems. It is believed that other standard overlay schemes based on the Moiré patterns may be directly implemented to imprint lithography process.

Another concern with overlay alignment for imprint lithography processes that employ UV curable liquid materials may be the visibility of the alignment marks. For the overlay placement error measurement, two overlay marks, such as the marks discussed above with respect to FIGS. 8, 9 and 10, are employed, referred to collectively as overlay marks 80. However, since it is desirable for template 26 to be transparent to a curing agent, the template overlay marks, in some embodiments, are not opaque lines. Rather, the template overlay marks are topographical features of the template surface. In some embodiments, the overlay marks are made of the same material as the template. In addition, UV curable liquids may have a refractive index that is similar to the refractive index of the template materials, e.g., quartz. Therefore, when the UV curable liquid fills the gap between template 26 and substrate 30, template overlay marks may become very difficult to recognize. If the template overlay marks are made with an opaque material, e.g., chromium or nickel, the UV curable liquid below the overlay marks may not be properly exposed to the UV light.

In an embodiment, overlay marks are used on template 26 that are seen by optical imaging system 40 but are opaque to the curing light, e.g., uv light. An embodiment of this approach is illustrated in FIG. 11. Instead of completely opaque lines, overlay marks 80 on the template may be formed of fine polarizing lines 82. For example, suitable fine polarizing lines 82 have a width about ½ to ¼ of the wavelength of activating light used as the curing agent. The line width of fine polarizing lines 82 should be small enough so that activating light passing between two lines is diffracted sufficiently to cause curing of all the liquid below the lines. In such an embodiment, the activating light may be polarized according to the polarization of overlay marks 80. Polarizing the activating light provides a relatively uniform exposure to all regions of template 26, including regions having overlay marks 80. Light used to locate overlay marks 80 on template 26 may be broadband light or a specific wavelength that may not cure the liquid material. This light need not be polarized. Fine polarizing lines 82 are substantially opaque to the measuring light, thus making overlay marks 80 visible using established overlay error measuring tools. Fine polarized overlay marks are fabricated on template 26 using existing techniques, such as electron beam lithography.

In another embodiment, overlay marks 80 are formed of a different material than template 26. For example, a material selected to form the template overlay marks may be substantially opaque to visible light but transparent to activating light used as the curing agent, e.g., UV light. For example, $SiO_x$, where x is less than 2, may be used as such a material. In particular, structures formed of $SiO_x$, where x is about 1.5, are substantially opaque to visible light, but transparent to UV curing light. Alternatively, or in conjunction with the $SiO_x$, alignment marks may be formed from a metal, i.e., chromium, nickel, and the like. In this manner, alignment marks 80 are opaque to both the analyzing light and the activating light. To ensure that alignment marks 80, such as the metal alignment marks, do not compromise the imprint pattern by, inter alia, blocking the activating light, alignment marks 80 may be positioned outside of the imprinting area, e.g., alignment marks 80 may be positioned in a region in which no features are patterned. To that end, a template 326 includes four molds 328, 330, 332 and 334, each of which has features f1, f2, f3 and f4, respectively, with alignment marks 80 disposed in a region of template 326 outside of molds 328, 330, 332 and 334.

Figure 12:
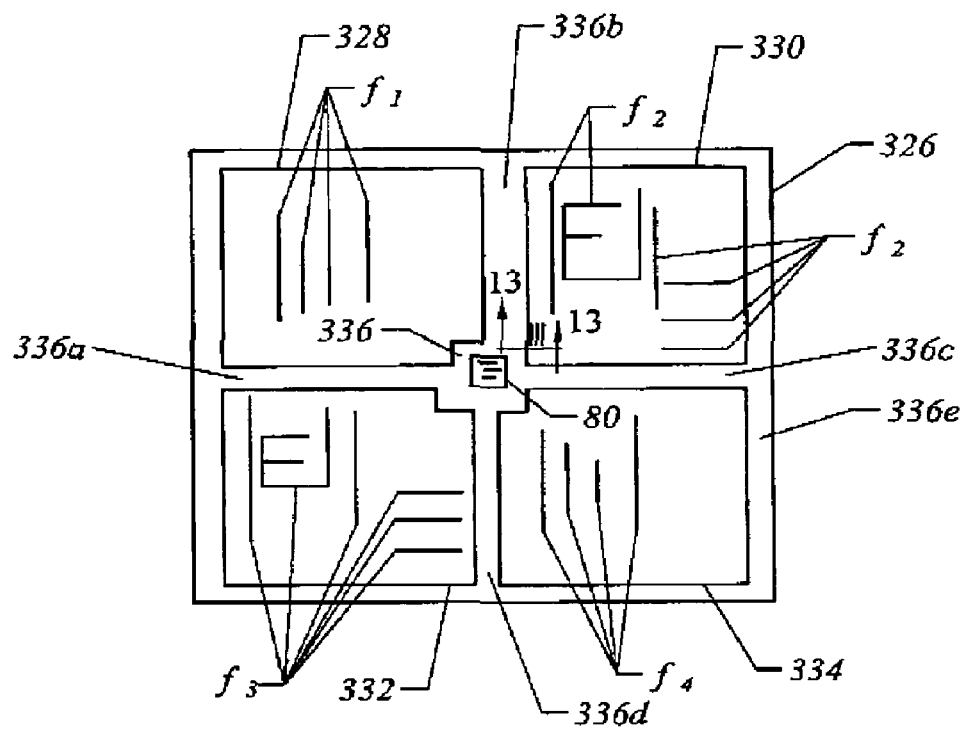
FIG. 12 is a plan view of a template showing an arrangement of alignment marks thereon in accordance with an alternate embodiment of the present invention.
Figure 13:
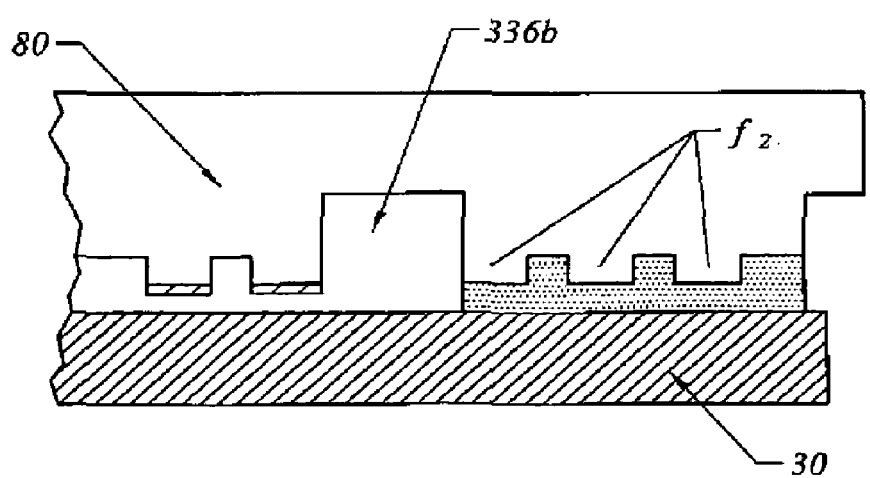
FIG. 13 is a cross-sectional view of the template shown in FIG. 12 taken along lines 13—13.

Referring to FIGS. 12 and 13, to prevent imprinting material (not shown) from entering a region of substrate 30 in superimposition with alignment marks 80, alignment marks 80 are surrounded by a moat system 336. This is important as the opaqueness of alignment marks 80 formed from metal would hinder, if not prevent, solidification of curable liquid. Segments 336a, 336b, 336c and 336d of moat system 336 separate molds 328, 330, 332 and 334. Specifically, segments 336a, 336b, 336c and 336d have a sufficient depth to curable liquid from substantially egressing therein from adjacent active molds 328, 330, 332 and 334 due to capillary forces. Additionally, moat system 336 may include a segment 336e that surrounds molds 328, 330, 332 and 334.

Figure 14:
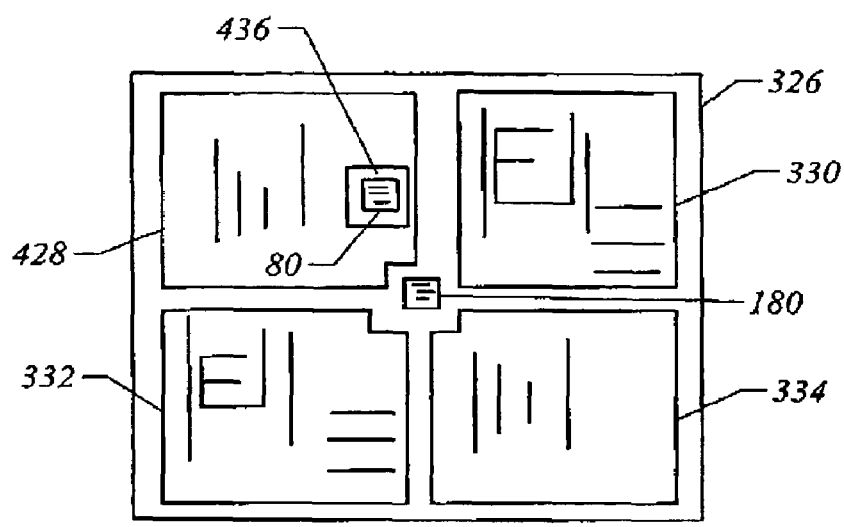
FIG. 14 is a plan view of a template showing an arrangement of alignment marks thereon in accordance with a third alternate embodiment of the present invention.
Figure 15:
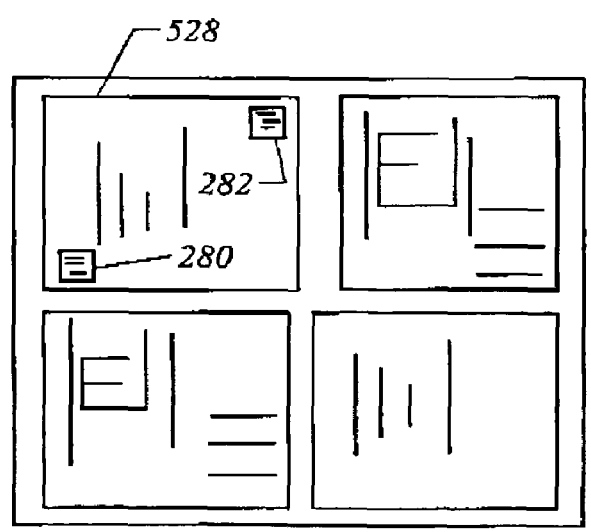
FIG. 15 is a plan view of a template showing an arrangement of alignment marks thereon in accordance with a fourth alternate embodiment of the present invention.

Referring to FIG. 14 in another embodiment, alignment marks 80 may be placed within a mold, shown as a mold 428. However, the region of mold 428 in which alignment marks 80 are positioned does not include any patterned features. Alignment marks 80 are surrounded by moat 436 so as to prevent liquid imprinting material from coming into contact therewith for the reasons discussed above with respect to FIGS. 11 and 12. Alternatively, an additional set of alignment marks may be included in a region outside of molds 428, 330, 332, 334, shown as alignment marks 180. Additionally, alignment marks 280 and 282 may be disposed at opposite corners of a mold, such as a template 528 shown in FIG. 15. Alignment marks 280 and 282 may or may not be surrounded by a moat to prevent liquid imprinting material from coming into contact therewith, as discussed above with respect to moat 436 in FIG. 14. Additionally, it has been found desirable to have at least one of alignment marks 280 and 282 not surrounded by a moat and not formed from opaque material.

From the foregoing, it is seen that alignment marks 80 formed from metal may be employed without degrading the underlying pattern generated during imprinting. Employing metal alignment marks may reduce the processing time required when manufacturing template 326. For example, template 326 may be patterned with features f1, f2, f3, and f4, as well as alignment marks 80 using e-beam lithography. As is well known, chromium or some other metals is employed as masking material during e-beam patterning processes. Arranging alignment marks 80 as discussed above would enable leaving masking metals in the region of alignment marks 80 after e-beam patterning.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A template having alignment marks formed thereon, said template comprising:
    a body having a patterning area, with said alignment marks being positioned on a region of said template outside of said patterning area and further being surrounded by a moat, with said alignment marks comprising a material opaque to a first wavelength of light.

2. The template as recited in claim 1 wherein said material is a metal.

3. The template as recited in claim 1 wherein said material is selected from a set consisting of chromium and nickel.

4. The template as recited in claim 1 further including additional alignment marks positioned on said patterning area.

5. The template as recited in claim 1 wherein said template is transparent to said first wavelength of light.

6. The template as recited in claim 1 wherein said template is transparent to a second wavelength of light differing from said first wavelength of light, with said alignment marks being transparent to said second wavelength of light.

7. The template as recited in claim 1 wherein said template further includes a mold, with said patterning area being positioned within a first region of said mold and further including additional alignment marks, with said alignment marks and said additional alignment marks defining first and second sets of alignment marks, with said first set of alignment marks being disposed within said mold and said second set being disposed outside of said mold.

8. The template as recited in claim 1 wherein said template is formed from a material selected from a group of materials comprising fused-silica, quartz, silicon, organic polymers, siloxane polymers, borosilicate glass, fluorocarbon polymers, metal, and hardened sapphire.

9. The template as recited in claim 1 further including additional alignment marks comprising a material transparent to said first wavelength of light.

10. A template having alignment marks formed thereon, said template comprising:
    a body having a patterning area, defining a mold, with said alignment marks being arranged in first and second sets comprising a material opaque to a first wavelength of light, with said first set being disposed on a region of said template outside of said mold and said second set being disposed within said mold, with said body further including a first moat surrounding said first set and a second moat surrounding said second set.

11. The template as recited in claim 10 wherein said material is selected from a set consisting of chromium and nickel.

12. The template as recited in claim 10 wherein said template is transparent to said first wavelength of light.

13. The template as recited in claim 10 wherein said template is transparent to a second wavelength of light differing from said first wavelength of light, with said alignment marks being transparent to said second wavelength of light.

14. The template as recited in claim 10 further including additional alignment marks comprising a material transparent to said first wavelength of light.

15. The template as recited in claim 10 wherein said template is formed from a material selected from a group of materials comprising fused-silica, quartz, silicon, organic polymers, siloxane polymers, borosilicate glass, fluorocarbon polymers, metal, and hardened sapphire.

16. A template having alignment marks formed thereon, said template comprising:

a body having a patterning area, defining a mold, with said alignment marks being arranged in first and second sets and comprising a material opaque to a first wavelength of light, said first set being disposed on a region of said template outside of said mold and said second set being disposed within said mold, with said body further including a first moat surrounding said first set and a second moat surrounding said second set, wherein said material is a metal.

17. The template as recited in claim 16 wherein said metal is selected from a set consisting of chromium and nickel.

18. The template as recited in claim 17 wherein said template is transparent to said first wavelength of light.

19. The template as recited in claim 18 wherein said template is transparent to a second wavelength of light that differs from said first wavelength of light, with said alignment marks being transparent to said second wavelength of light.

20. The template as recited in claim 19 wherein said template is formed from a material selected from a group of materials comprising fused-silica, quartz, silicon, organic polymers, siloxane polymers, borosilicate glass, fluorocarbon polymers, metal, and hardened sapphire.

* * * * *